United States Patent [19]

Bridgewater

[11] 4,307,467
[45] Dec. 22, 1981

[54] CONTINUOUS TUNING ARRANGEMENT FOR A MULTIBAND TELEVISION RECEIVER

[75] Inventor: Thomas A. S. Bridgewater, Indianapolis, Ind.

[73] Assignee: RCA Corporation, New York, N.Y.

[21] Appl. No.: 156,435

[22] Filed: Jun. 4, 1980

Related U.S. Application Data

[63] Continuation of Ser. No. 965,229, Nov. 30, 1978, abandoned.

[51] Int. Cl.³ .............................................. H04B 1/16
[52] U.S. Cl. ................................... 455/176; 455/180; 335/15
[58] Field of Search ............... 455/173, 176, 180, 188, 455/191, 182; 358/191.1, 193.1; 334/15, 18

[56] References Cited

U.S. PATENT DOCUMENTS

| | | | |
|---|---|---|---|
| 3,715,495 | 2/1973 | Takezaki et al. | 358/193.1 |
| 3,965,427 | 6/1976 | Ma | 455/180 |
| 4,081,771 | 3/1978 | Hendrickson | 455/182 |

FOREIGN PATENT DOCUMENTS

| | | |
|---|---|---|
| 1088450 | 10/1967 | United Kingdom . |
| 1095006 | 12/1967 | United Kingdom . |
| 1128909 | 10/1968 | United Kingdom . |
| 1088539 | 5/1969 | United Kingdom . |
| 1088990 | 6/1970 | United Kingdom . |
| 1201385 | 8/1970 | United Kingdom . |

Primary Examiner—Jin F. Ng
Attorney, Agent, or Firm—Eugene M. Whitacre; Paul J. Rasmussen; Peter M. Emanuel

[57] ABSTRACT

A varactor controlled tuning system for a television receiver includes first, second and third separated resistive sections formed on a dielectric substrate, a movable contact and means for moving the movable contact along the resistive sections. First and second voltages corresponding to the magnitude of a tuning voltage for the lowest and highest frequency channels in a low VHF band are coupled to the beginning and end points, respectively, of the first section. Third and fourth voltages corresponding to the magnitudes of the tuning voltage for the lowest and highest frequency channels in a high VHF band are coupled to the beginning and end points, respectively, of the second section. Fifth and sixth voltages corresponding to the magnitudes of the tuning voltage for the lowest and highest frequency channel in a UHF band are coupled to beginning and end points, respectively, of the third section. The tuning voltage for the tuner is developed at the movable contact.

10 Claims, 4 Drawing Figures

CONTINUOUS TUNING ARRANGEMENT FOR A MULTIBAND TELEVISION RECEIVER

This is a continuation of application Ser. No. 965,229, filed Nov. 30, 1978, now abandoned.

BACKGROUND OF THE PRESENT INVENTION

The present invention pertains to the field of tuners with voltage variable frequency determining elements.

Electronic tuners for television receivers conventionally comprise a tuned circuit including a varactor diode reverse biased to exhibit a capacitive characteristic and an inductor for each of the television bands. For example, in the United States, television receivers include tuned circuits including a varactor diode and an inductor for a low VHF band including channels 2 through 6, a high VHF band including channels 7 through 13 and a UHF band including channels 14 through 83. The tuned circuits are selectively enabled by bandswitching signals representative of the band in which a selected channel resides. The capacitive reactance of the varactor diode and thereby the frequency to which the tuned circuits are tuned is determined by the magnitude of a tuning voltage.

Many systems deriving the tuning voltage are known. One of the simplest and therefore most economical types of these systems includes a potentiometer coupled between two points of potential. The tuning voltage is derived at a movable contact or wiper arm of the potentiometer and therefore is continuously variable. This permits a single tuning control for both coarse and fine tuning. In addition, such systems are rapidly tunable compared to so-called mechanical detent tuners.

Unfortunately, in general, the bands of tuning voltage corresponding to the three bands of the television tuning range are not consecutive but rather overlap each other. That is, the magnitudes of tuning voltage corresponding to the lowest frequency channels in the high VHF and UHF bands are lower than the magnitudes of tuning voltage corresponding to the highest frequency channels in the respective one of the preceding bands. Therefore, television tuning systems of this type in which a tuning voltage is generated at the movable contact of a potentiometer have typically not been able to continuously and consecutively tune a television receiver throughout the televison tuning range.

SUMMARY OF THE PRESENT INVENTION

A tuning system for continuously and consecutively tuning a receiver to various channels in at least a first and a second tuning band includes a frequency tunable circuit, voltage variable means for determining the frequency response of said frequency tunable circuit in response to a tuning voltage, first and second resistive sections corresponding to the first and second tuning bands positioned on a dielectric member and a movable contact and a means for moving the movable contact along the first and second sections. Points along the first resistive section correspond to channels in the first band. Points along the second resistive section correspond to channels in the second band. First, second, third and fourth voltages corresponding to the lowest frequency channel in the first band, the highest frequency channel in the first band, the lowest frequency channel in the second band and the highest frequency channel in the second band are coupled to respective points along the first and second resistive sections. The tuning voltage is developed at the movable contact.

DETAILED DESCRIPTION OF THE DRAWING

Figure 1:
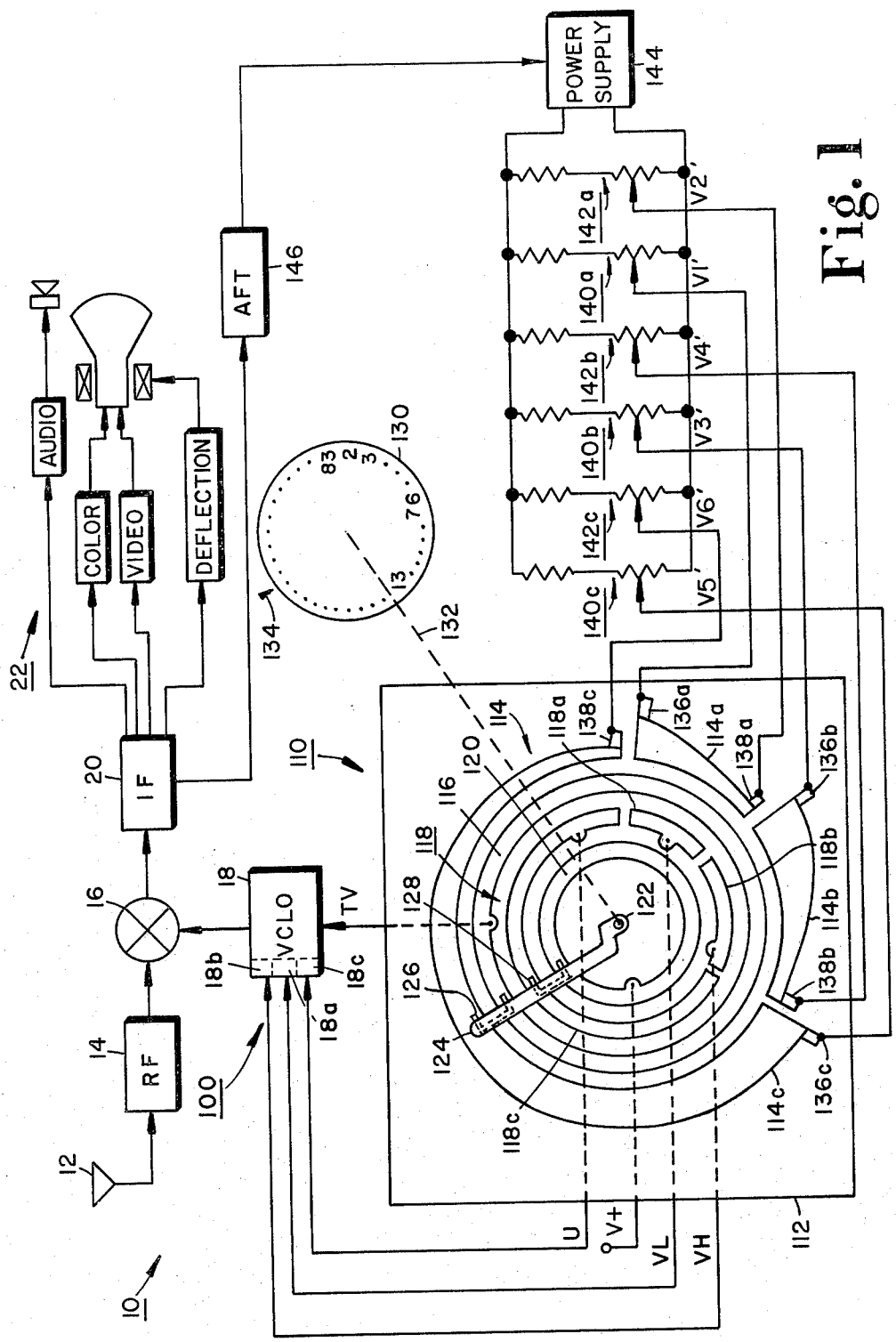
FIG. 1 shows in block diagram form a television receiver employing a tuning system constructed in accordance with the present invention.

In FIG. 1, a television receiver 10 includes an antenna 12 which couples RF signals to an RF signal processing unit 14. RF signal processing unit 14 filters and amplifies the RF signals. A mixer 16 combines the processed RF signals with a local oscillator signal generated by a voltage controlled local oscillator (VCLO) 18 to produce an IF signal. The IF signal is amplified and filtered by an IF signal processing unit 20. The processed IF signal contains components bearing video, color, deflection and sound information. The various components of the processed IF signal are coupled to respective sections of picture and audio portion 22 of receiver 10.

Voltage controlled local oscillator 18 comprises a selectively enabled tuning arrangement including a varactor diode and an inductor for each of the television tuning bands to which receiver 10 may be tuned. In the United States, the television range is partitioned into a low VHF band for channels 2 through 6, a high VHF band for channels 7 through 13 and a UHF band for channels 14 through 83. In receiver 10 arranged, by way of example, for NTSC standards utilized in the United States, bandswitching signals VL (for the low VHF band), VH (for the high VHF band) and U (for the UHF band) selectively enable respective tuning arrangements 18a, 18b and 18c of VCLO 18 to determine the frequency band in which it oscillates. The magnitude of a tuning voltage TV determines the specific frequency at which VCLO 18 oscillates. Although the various tuning arrangements are selectively enabled by different bandswitching signals, the same tuning voltage is coupled to each of the arrangements. As is typical, the tuning voltage and bandswitching signals are also coupled (by connections not shown) to varactor tuning arrangements in RF unit 14 corresponding to those of VCLO 18 so that amplitude versus frequency response of RF unit 14 will track the tuning of VCLO 18.

RF unit 14, mixer 16 and VCLO 18 may comprise the combination of a KRK-228 VHF varactor diode tuner and a KRK-226 UHF varactor diode tuner as disclosed in "RCA Television Service Data-Chassis CTC-74 Series," File 1977, C-9, published by RCA Corporation, Indianapolis, Ind., hereby incorporated by reference.

Figure 2:
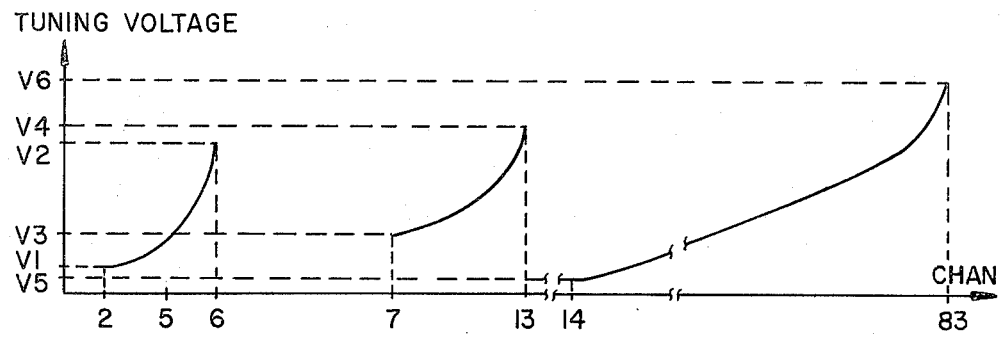
FIG. 2 shows graphical representations of tuning voltage versus channel characteristics of varactor diode tuning arrangements useful in facilitating an understanding of the tuning system shown in FIG. 1.

Typical tuning voltage versus channel frequency characteristics for a varactor oscillator of the type which may be employed as VCLO 18 are shown in FIG. 2. The tuning characteristics for the three bands are separate. The magnitudes for the beginning and end points of the three bands are as indicated: V1 corresponds to the lowest frequency channel in the low VHF band; V2 corresponds to the highest frequency channel in the low VHF band; V3 corresponds to the lowest frequency channel in the high VHF band; V4 corresponds to the highest frequency channel in the high VHF band; V5 corresponds to the lowest frequency channel in the UHF band; and V6 corresponds to the highest frequency channel in the UHF band. The three bands have tuning voltage regions which overlap each other. Thus, although the frequency of channel 7 is higher than the frequency of channel 6, the magnitude of tuning voltage V3 for channel 7 is lower than the magnitude of tuning voltage V2 for channel 6. Similarly, although the frequency of channel 14 is higher than the frequency of channel 13, the magnitude of tuning voltage V5 for channel 14 is lower than the magnitude of tuning voltage V4 for channel 13. As a result, television tuning systems including a potentiometer in which a tuning voltage is generated at the movable contact of the wiper arm have not been continuously and consecutively tunable from channel 2 to channel 83. Tuning system 100 shown in FIG. 1 overcomes this deficiency.

Tuning system 100 comprises a potentiometer arrangement 110. Potentiometer arrangement 110 includes a substrate 112 of a dielectric material such as a ceramic upon which are formed a resistive element 114 and conductors 116, 118 and 120. Resistive element 114 may be a resistive film printed on substrate 112. Conductors 116, 118 and 120 may be formed on substrate 112 by printed circuit board techniques. Resistive element 114 and conductors 116, 118 and 120 are formed along concentric circular paths having a center 122. A wiper arm 124 is rotatable about center 122. Wiper arm 124 includes two bifurcated contacts 126 and 128. The contact surfaces of contact 126 make contact with resistive element 114 and conductor 116. The contact surfaces of contact 128 make contact with conductors 120 and 118. The contact surfaces of contacts 126 and 128 are in angular alignment. Wiper arm 124 is mechanically coupled to a dial 130 by a shaft 132. Dial 130 has channel numbers between 2 and 83 formed at points along its perimeter corresponding to points along the circular paths of resistive element 114 and conductors 116, 118 and 120. A pointer 134 indicates the angular position of dial 130 and thereby the presently selected channel.

Resistive element 114 has three separated resistive sections 114a, 114b and 114c. Each of the sections corresponds in a portionate relationship to a particular tuning band: section 114a corresponds to the low VHF band; section 114b corresponds to the high VHF band; and section 114c corresponds to the UHF band. Each of sections 114a, 114b and 114c has terminals at its end points corresponding to the lowest and highest frequency channels in the respective band. The gaps between resistive sections 114a, 114b and 114c have arcuate lengths greater than the arcuate length of the contact surface of contact 126 along the circular path of resistive element 114, but less than the arcuate length between points along the circular path of conductor 118 corresponding to channels 6 and 7, 13 and 14, and 83 and 2, respectively. Terminals 136a, 138a, 136b, 138b, 136c and 138c are coupled to respective sources of voltages shown as resistive voltage dividers 140a, 142a, 140b, 142b, 140c and 142c. Voltage dividers 140a, 142a, 140b, 142b, 140c and 142c are coupled in parallel relationship across a power supply 144. The voltages coupled to voltage dividers 140a, 142a, 140b, 142b, 140c and 142c from power supply 144 are modified in response to an AFT (automatic fine tuning) signal derived by an AFT discriminator 146 in response to the frequency difference between the frequency of the carrier of the video component of the IF signal and its nominal value, e.g., 45.75 MHz. One arrangement for such purpose is disclosed in the aforementioned RCA Service Data. Each of voltage dividers 140a, 142a, 140b, 142b, 140c and 142c includes a variable resistance element shown as a potentiometer to adjust voltages V1', V2', V3', V4', V5' and V6' developed at terminals 136a, 138a, 136b, 138b, 136c and 138c, respectively. The magnitudes of voltages V1', V2', V3', V4', V5' and V6' are set slightly below magnitude V1, slightly above magnitude V2, slightly below magnitude V3, slightly above magnitude V4, slightly below magnitude V5 and slightly above magnitude V6, respectively. The tuning voltage is developed at contact 126 and coupled by means of conductor 116, which serves as a commutator, to VCLO 18 and RF unit 14.

Conductor 118 includes three separate conductor sections 118a, 118b and 118c in angular alignment with resistive sections 114a, 114b and 114c, respectively, of resistive element 114. The gaps between conductor sections 118a, 118b and 118c have arcuate lengths greater than the arcuate lengths of the contact surface of contact 128 along the circular path of conductor 118, but less than the arcuate length between points along the circular path of conductor 118 corresponding to channels 6 and 7, 13 and 14, and 83 and 2, respectively. A predetermined voltage V+ is coupled to conductor 120. Conductor 120 serves as a commutator and in conjunction with bifurcated contact 128 couples voltage V+ in sequence to conductor sections 118a, 118b and 118c as dial 130 is rotated. Conductor sections 118a, 118b and 118c are coupled to VCLO 18 and generate bandswitching signals VL, VH and U when contacted by contact 128.

As indicated in FIG. 2, the tuning voltage characteristics of the three bands are each nonlinear functions of channel. To compensate for the nonlinear tuning voltage characteristics, resistive sections 114a, 114b and 114c are each tapered as a function of angular position to have resistances which are lower at points corresponding to lower channels than at points corresponding to higher channels. As a result, points along resistive element 114 corresponding to adjacent channels and channel numbers on dial 130 are separated by equal angular increments.

Figures 3, 3A:
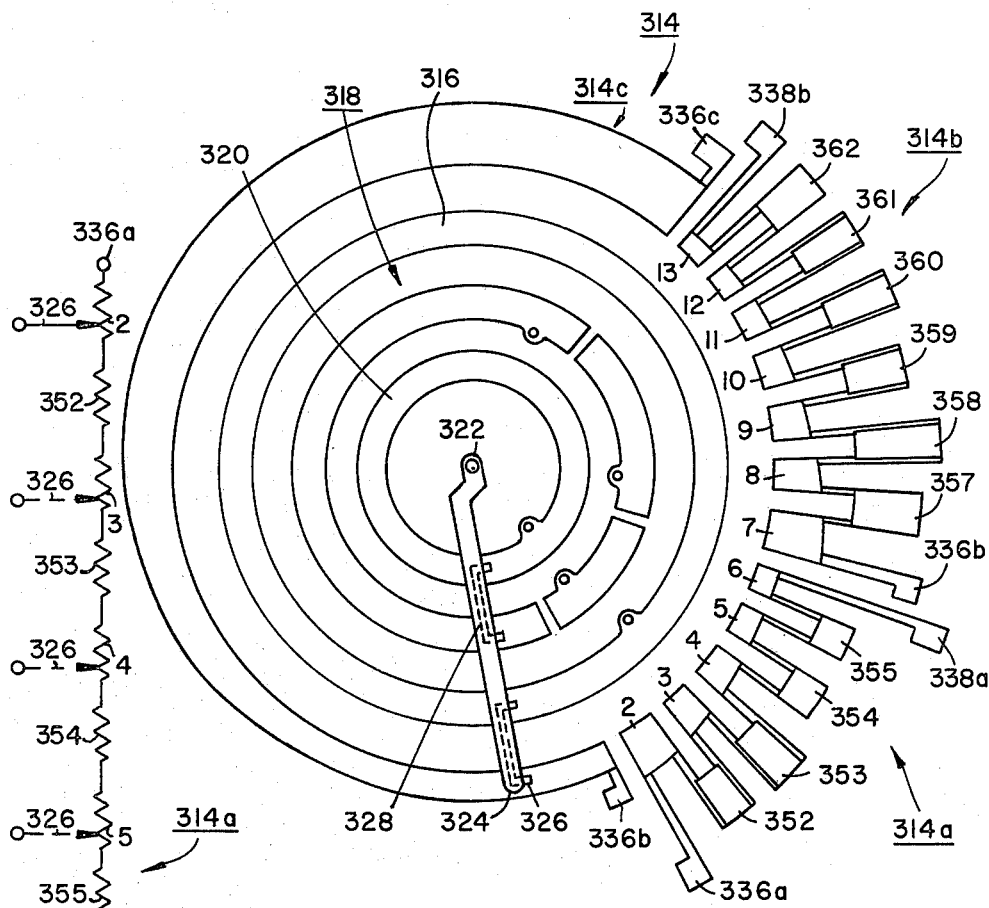
FIG. 3 shows in a plan view an embodiment of the mechanical portion of another tuning system constructed in accordance with the present invention.
FIG. 3a shows in schematic diagram form the electric circuit corresponding to a portion of the mechanical configuration shown in FIG. 3.

It will be noted that the tuning voltage characteristics of the low VHF and high VHF bands are somewhat more nonlinear than is the tuning voltage characteristic for the UHF band. The effect of this is that it may be more difficult to predictably compensate for the nonlinear tuning voltage characteristics of the low VHF and high VHF bands than for the nonlinear tuning voltage characteristic of the UHF band. To correct this situation, sections 114a and 114b of resistive element 114 may be replaced by resistive sections 314a and 314b, respectively, shown in FIG. 3. In the arrangement shown in FIG. 3, elements corresponding to the same or similar elements of the arrangement shown in FIG. 1 are identified by reference numbers having the same last two digits. In resistive sections 314a and 314b, each channel has a respective resistive subsection identified by the corresponding channel number. Each resistive subsection is physically separated from adjacent resistive subsections by gaps greater than the arcuate length of the contact surface of contact 326 along the circular path of resistive element 314, but less than the arcuate length between points along the circular path of resistive element 314 corresponding to adjacent channels. However, within each of resistive sections 314a and 314b, the resistive subsections are electrically coupled in series between terminals 336a and 338a and 336b and 338b, respectively, through resistive areas 352-362 as is schematically indicated in FIG. 3a. Resistive areas 352-362 are formed in the same manner and and at the same time as the remaining portions of resistive element 314 and coupled between adjacent resistive areas by conductors formed on the substrate in the same manner and at the same time as the other conductors. The resistances of resistive areas are determined by their width and length: their resistance being inversely proportional to their radial length and directly proportional to their arcuate width. Resistive areas 352-362 determine the voltages coupled to the end points of each resistive subsection and thereby make it possible to more precisely compensate for the nonlinear tuning voltage characteristics of the low VHF and high VHF bands. As indicated, resistive sections 314a and 314b are also tapered to compensate for the nonlinear tuning voltage characteristics of the low VHF and high VHF bands. From a user point of view, there is no appreciable difference in the "feel" imparted by the arrangements shown in FIGS. 1 and 3. For example, each channel still has an associated fine tuning range as indicated in FIG. 3a.

Thus, what has been described are tuning systems in which a tuning voltage is derived at the wiper arm of a potentiometer which is continuously and consecutively tunable throughout the television range. Since it does not have mechanical detents, it is rapidly tunable from any channel to any other, including tuning from UHF channels to VHF channels without changing tuning direction. In addition, fine tuning is simplified since a user tends to tune through the tuning range associated with each channel from beginning to end.

What is claimed is:

1. A tuning system for tuning a receiver to various channels in at least a first and a second band of frequencies comprising:
    a frequency tunable circuit;
    voltage variable means for determining the frequency to which said tunable circuit is tuned in response to a tuning voltage, said tuning voltage having first, second, third and fourth magnitudes corresponding to the lowest frequency channel in said first band, the highest frequency channel in said first band, the lowest frequency channel in said second band and the highest frequency channel in said second band, respectively, said voltage variable means having a voltage versus channel characteristic which is nonlinear in at least one of said bands;
    means for developing first, second, third and fourth voltages corresponding to said first, second, third and fourth magnitudes, respectively;
    a dielectric substrate;
    a first and a second resistive section positioned in a successive order on said dielectric substrate, points along said first section corresponding to channels in said first band and points along said second section corresponding to channels in said second band;
    coupling means for coupling said first and second voltages to ones of said points of said first section corresponding to said lowest frequency channel in said first band and said highest frequency channel in said first band, respectively, and coupling said third and fourth voltages to ones of said points of said second section corresponding to said lowest frequency channel in said second band and said highest frequency channel in said second band, respectively;
    a movable contact; and
    means for moving said contact in continuous fashion along the surfaces of said first and second resistive sections in said successive order;
    said tuning voltage being developed at said movable contact;
    the one of said resistive sections corresponding to said one of said bands having a nonlinear voltage versus channel characteristic being shaped to compensate for said nonlinear voltage versus channel characteristic so that points along said one resistive section corresponding to adjacent channels are separated by substantially equal increments.

2. The apparatus recited in claim 1 wherein:
    said first and second resistive sections are physically separated by a distance greater than the dimension of the portion of said movable contact which contacts said resistive sections and less than the distance corresponding to points along said resistive sections corresponding to adjacent channels.

3. The apparatus recited in claim 2 wherein:
    the magnitude of said first voltage is slightly less than said first magnitude; the magnitude of said second voltage is slightly greater than said second magnitude; the magnitude of said third voltage is slightly less than said third magnitude; and the magnitude of said fourth voltage is slightly greater than said fourth magnitude.

4. The apparatus recited in claim 3 wherein:
    said first and second resistive sections are arcuate and are positioned along a circular path on said dielectric substrate;
    said means for moving said contact is a member pivotable about an axis at the center of said circular path, said movable contact being mounted at a point on said arm member to contact, in order, said first and second sections.

5. The apparatus recited in claim 4 wherein:
    each of said first and second resistive sections is a continuous resistive film formed on said dielectric substrate.

6. The apparatus recited in claim 4 wherein:
    one of said first and second resistive sections is partitioned into separated resistive subsections of resistive material formed on said dielectric substrate, each of said resistive subsections corresponding to a range of tuning voltage magnitudes associated with a respective channel; and
    resistance elements are coupled between each of said resistive subsections, said resistance elements having values selected to define each of said ranges of tuning voltage magnitudes.

7. The apparatus recited in claim 6 wherein:
    said resistive subsections and said resistive elements are resistive films printed on said dielectric substrate.

8. A tuning system for continuously tuning a television receiver to various channels in a low VHF band, a high VHF band and a UHF band, comprising:
- a frequency tunable circuit;
- voltage variable means for determining the frequency to which said tunable circuit is tuned in response to a tuning voltage, said tuning voltage having first, second, third, fourth, fifth and sixth magnitudes corresponding to the lowest frequency channel in said low VHF band, the highest frequency channel in said low VHF band, the lowest frequency channel in said high VHF band, the highest frequency channel in said high VHF band, the lowest frequency channel in said UHF band and the highest frequency channel in said UHF band, respectively, said voltage variable means having a voltage versus channel characteristic which is nonlinear in at least one of said bands;
- means for developing first, second, third, fourth, fifth and sixth voltages corresponding to magnitudes of said tuning voltage slightly less than said first magnitude, slightly greater than said second magnitude, slightly less than said third magnitude, slightly greater than said fourth magnitude, slightly less than said fifth magnitude and slightly greater than said sixth magnitude, respectively;
- a dielectric substrate;
- first, second and third electrically separate sections of resistive film formed on said dielectric substrate in a circular path in the order named, first and second points along said circular path defining the beginning and end, respectively, of said first section, third and fourth points along said circular path defining the beginning and end, respectively, of said second section, fifth and sixth points along said circular path defining the beginning and end, respectively, of said third section;
- first, second, third, fourth, fifth and sixth means for developing first, second, third, fourth, fifth and sixth voltages corresponding to said first, second, third, fourth, fifth and sixth magnitudes of said tuning voltage, respectively, at said first, second, third, fourth, fifth and sixth points;
- a movable contact;
- means for moving said movable contact across said first, second and third sections along said circular path;
- said tuning voltage being developed at said movable contact; and
- the one of said sections of resistive film corresponding to said one of said bands having a nonlinear voltage versus channel characteristic being shaped to compensate for said nonlinear voltage versus channel characteristic so that points along said one section corresponding to adjacent channels are separated by substantially equal angular increments.

9. The apparatus recited in claim 8 wherein:
- at least one of said tunable circuit and said voltage variable means includes first, second and third arrangements selectively enabled in response to first, second and third bandswitching signals, respectively, to render said tunable circuit tunable in said low VHF, high VHF and UHF bands; and further including
- first, second and third separate conductive sections formed on said dielectric substrate along a third circular path concentric with said first and second circular paths and in angular alignment with said first, second and third resistive sections, respectively;
- a second commutator conductor formed on said dielectric substrate along a fourth circular path concentric with said first, second and third circular paths; and
- a second movable contact having first and second contact surfaces in angular alignment with said first and second contact surfaces of said first movable contact and positioned on said rotatable member to contact said first, second and third conductive sections with said first contact surface and to contact said second commutator conductor with said second contact surface;
- said second ring being electrically coupled to a source of a predetermined voltage to develop said first, second and third bandswitching signals at said first, second and third conductive sections, respectively, when said first contact is in contact with said first resistive section, said second resistive section and said third resistive section, respectively.

10. The apparatus recited in claim 8 wherein:
- said movable means includes a member rotatable about the center of said circular path, a commutator conductor formed on said dielectric substrate along a second circular path concentric with respect to said first mentioned circular path and being electrically coupled to said variable voltage means, said movable contact having first and second contact surfaces and being positioned on said rotatable member to contact said first, second and third resistive sections with said first contact surface and to contact said commutator ring with said second surface.

* * * * *